(12) United States Patent
Sakanishi

(10) Patent No.: US 12,060,498 B2
(45) Date of Patent: *Aug. 13, 2024

(54) HYDROPHILIZATION TREATMENT LIQUID FOR SEMICONDUCTOR WAFER SURFACE

(71) Applicant: DAICEL CORPORATION, Osaka (JP)

(72) Inventor: Yuichi Sakanishi, Tokyo (JP)

(73) Assignee: DAICEL CORPORATION, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/261,931

(22) PCT Filed: Mar. 18, 2020

(86) PCT No.: PCT/JP2020/012142
§ 371 (c)(1),
(2) Date: Jan. 21, 2021

(87) PCT Pub. No.: WO2020/196199
PCT Pub. Date: Oct. 1, 2020

(65) Prior Publication Data
US 2021/0343542 A1    Nov. 4, 2021

(30) Foreign Application Priority Data

Mar. 22, 2019  (JP) ................. 2019-054530

(51) Int. Cl.
*C09G 1/04*       (2006.01)
*C08G 65/00*      (2006.01)
*C08L 71/02*      (2006.01)
*C08L 71/08*      (2006.01)
*H01L 21/321*     (2006.01)

(52) U.S. Cl.
CPC ............ *C09G 1/04* (2013.01); *C08G 65/00* (2013.01); *C08L 71/02* (2013.01); *C08L 71/08* (2013.01); *H01L 21/3212* (2013.01); *C08G 2650/54* (2013.01)

(58) Field of Classification Search
None
See application file for complete search history.

(56) References Cited

U.S. PATENT DOCUMENTS

| | | | |
|---|---|---|---|
| 3,637,774 A * | 1/1972 | Babayan | C07C 43/135 528/80 |
| 6,420,209 B1 | 7/2002 | Matsuzawa et al. | |
| 6,740,590 B1 | 5/2004 | Yano et al. | |
| 7,459,398 B2 | 12/2008 | Minamihaba et al. | |
| 8,273,921 B2 | 9/2012 | Sakanishi et al. | |
| 9,346,977 B2 | 5/2016 | Minami et al. | |
| 10,196,542 B2 | 2/2019 | Minami et al. | |
| 10,466,592 B2 | 11/2019 | Sakanishi | |
| 10,844,334 B2 | 11/2020 | Sakanishi | |
| 11,279,905 B2 | 3/2022 | Sakanishi | |
| 2006/0000808 A1 | 1/2006 | Seki et al. | |
| 2006/0030503 A1 | 2/2006 | Minamihaba et al. | |
| 2008/0300429 A1 | 12/2008 | Sakanishi et al. | |
| 2009/0104778 A1 | 4/2009 | Sakanishi et al. | |
| 2011/0251437 A1 | 10/2011 | Sakanishi et al. | |
| 2013/0203254 A1 | 8/2013 | Tamada et al. | |
| 2015/0024596 A1 | 1/2015 | Minami et al. | |
| 2016/0009619 A1 * | 1/2016 | Maehara | C08G 65/34 514/723 |
| 2016/0040041 A1 | 2/2016 | Minami et al. | |
| 2018/0195030 A1 | 7/2018 | Sakanishi | |
| 2018/0231890 A1 | 8/2018 | Sakanishi | |
| 2019/0093056 A1 * | 3/2019 | Yoshino | C11D 11/0094 |
| 2019/0249122 A1 | 8/2019 | Uchida | |

FOREIGN PATENT DOCUMENTS

| | | |
|---|---|---|
| CN | 101010274 A | 8/2007 |
| CN | 103154168 A | 6/2013 |
| CN | 108303862 A | 7/2018 |

(Continued)

OTHER PUBLICATIONS

H. Sagitani et al., "Solution Properties of Homogeneous Polyglycerol Dodecyl Ether Nonionic Surfactant", JAOCS, vol. 66, pp. 146-152. (Year: 1989).*
T. Kato et al., "Surface properties of purified polyglycerol monolaurates", Journal of Surfactants and Detergents, vol. 6, pp. 331-337. (Year: 2003).*
U.S. Appl. No. 17/262,088, filed Jan. 21, 2021.
International Search Report for International Application No. PCT/JP2020/011996, dated Jun. 16, 2020, with an English translation.
International Search Report for International Application No. PCT/JP2020/012142, dated Jun. 9, 2020, with an English translation.

(Continued)

*Primary Examiner* — Jiong-Ping Lu
(74) *Attorney, Agent, or Firm* — Birch, Stewart, Kolasch & Birch, LLP

(57) ABSTRACT

Provided is a hydrophilization treatment liquid for a semiconductor wafer surface, the hydrophilization treatment liquid being capable of imparting hydrophilicity to the semiconductor wafer surface.

A hydrophilization treatment liquid for a semiconductor wafer surface, the hydrophilization treatment liquid comprising water and a compound represented by Formula (1) below, and a total content of the water and the compound represented by Formula (1) below being 95 wt. % or greater.

$$R^1O-(C_3H_6O_2)_n-H \qquad (1)$$

where $R^1$ denotes a hydrogen atom, a hydrocarbon group having from 1 to 24 carbon atoms and optionally having a hydroxyl group, or a group represented by $R^2CO$, the $R^2$ denoting a hydrocarbon group having from 1 to 24 carbon atoms; and n indicates an average degree of polymerization of a glycerin unit in the parentheses, and is from 2 to 60.

15 Claims, No Drawings

(56) References Cited

FOREIGN PATENT DOCUMENTS

| | | | |
|---|---|---|---|
| CN | 108415226 A | 8/2018 | |
| JP | 10-270492 A | 10/1998 | |
| JP | 2006-49709 A | 2/2006 | |
| JP | 2006-49790 A | 2/2006 | |
| JP | 2009-99819 A | 5/2009 | |
| JP | 2015-205348 A | 11/2015 | |
| JP | 2018-6538 A | 1/2018 | |
| JP | 2018006538 * | 1/2018 | ............ B24B 37/00 |
| JP | 2018-78287 A | 5/2018 | |
| TW | 201831664 A | 9/2018 | |
| WO | WO 2013/125445 A1 | 8/2013 | |
| WO | WO2018079675 * | 5/2018 | ............... C11D 7/04 |

OTHER PUBLICATIONS

Written Opinion of the International Searching Authority for International Application No. PCT/JP2020/011996, dated Jun. 16, 2020.
Written Opinion of the International Searching Authority for International Application No. PCT/JP2020/012142, dated Jun. 9, 2020.
Chinese Office Action for Chinese Application No. 202080005198.6, dated Mar. 29, 2022, with English translation.
Taiwanese Office Action and Search Report for Taiwanese Application No. 109109429, dated Jul. 26, 2023.
Japanese Office Action (including an English translation thereof) issued in the Japanese Patent Application No. 2020-555263 on Apr. 23, 2024.

\* cited by examiner

HYDROPHILIZATION TREATMENT LIQUID FOR SEMICONDUCTOR WAFER SURFACE

TECHNICAL FIELD

The invention according to the present disclosure relates to a hydrophilization treatment liquid for a semiconductor wafer. This application claims priority to JP 2019-054530 filed in Japan on Mar. 22, 2019, the contents of which are incorporated herein by reference.

BACKGROUND ART

Ordinarily, in the manufacturing process of a semiconductor wafer (hereinafter, may be referred to simply as a "wafer"), a cut silicon monocrystalline ingot is subjected to a polishing process (usually three stages of primary polishing, secondary polishing, and finish polishing) after an etching treatment. In this polishing process, it is important to maintain a hydrophilic state of the wafer surface, to prevent contamination of the wafer surface. This is because when the wafer surface dries immediately after polishing, contaminants such as particles, metal impurities, and organic matter that are deposited during polishing become fixed to the wafer surface and are difficult to remove even in a subsequent washing step. The contaminants described above may results in surface defects (LPD: light point defects) in the wafer inspection process. Also, when LPD increase, the surface roughness (haze) also increases, leading to a reduction in the quality of the wafer surface. Therefore, conventionally, wafer surfaces after finish polishing have been made hydrophilic through measures such as adjusting the composition of the slurry.

The finish polished wafer is then subjected to a washing process. In this washing process, "water polishing" is performed. In the water polishing process, after finish polishing, a polishing device is operated while supplying washing water onto a polishing pad, and the polished surface of the wafer is rinsed. Thus, the alkaline abrasive material is prevented from etching the wafer surface excessively, and abrasive polishing grains deposited to the polished surface are washed away.

For example. Patent Document 1 discloses a method for cleaning a surface of a semiconductor wafer substrate, and the method includes a water polishing and washing process of polishing a surface of a polished wafer substrate by supplying only washing water not containing an abrasive material to the surface of the wafer substrate.

CITATION LIST

Patent Document

Patent Document 1: JP 10-270492 A

SUMMARY OF INVENTION

Technical Problem

However, in water polishing using only water, scrubbing with a polishing pad exposes the Si surface of the silicon wafer. Because the Si surface is a hydrophobic surface, it is easily contaminated by contaminants such as particles, metal impurities, and organic matter. Moreover, these contaminants deposited to the hydrophobic wafer surface tend to be difficult to remove. As a result, the finish polished wafer surface that had become hydrophilic reverts to a hydrophobic state due to the water polishing, and the contaminants described above may be adsorbed. Thus, the degree of cleanliness of the wafer surface problematically deteriorates.

Therefore, an object of the present disclosure is to provide a hydrophilization treatment liquid capable of imparting hydrophilicity to a semiconductor wafer surface.

Another object of the present disclosure is to provide a rinse polishing solution that is applied to the surface of a semiconductor wafer that has become hydrophilic after finish polishing, and thus the semiconductor wafer can maintain the hydrophilicity even after rinse polishing.

Yet another object of the present disclosure is to provide a method for manufacturing a semiconductor device, the method including subjecting the surface of a semiconductor wafer to a hydrophilization treatment using the hydrophilization treatment liquid.

Solution to Problem

As a result of diligent research to solve the problems described above, the present inventors discovered that hydrophilicity can be imparted to the surface of a semiconductor wafer using a hydrophilization treatment liquid for a semiconductor wafer surface, the hydrophilization treatment liquid containing water and a compound represented by Formula (1) below, and the total content of the water and the compound expressed by Formula (1) below being not less than 95 wt. %. The invention according to the present disclosure was completed based on these findings.

That is, the invention according to the present disclosure provides a hydrophilization treatment liquid for a semiconductor wafer surface (also referred to as a "hydrophilization treatment liquid of the present disclosure" hereinafter), the hydrophilization treatment liquid containing water and a compound represented by Formula (1) below, and a total content of the water and the compound represented by Formula (1) below being 95 wt. % or greater.

$$R^1O\text{—}(C_3H_6O_2)_n\text{—}H \tag{1}$$

where $R^1$ denotes a hydrogen atom, a hydrocarbon group having from 1 to 24 carbon atoms and optionally having a hydroxyl group, or a group represented by $R^2CO$, the $R^2$ denoting a hydrocarbon group having from 1 to 24 carbon atoms; and n indicates an average degree of polymerization of a glycerin unit shown in the parentheses, and is from 2 to 60.

In the hydrophilization treatment liquid, the content of the compound represented by Formula (1) is preferably from 0.01 to 1.5 wt. %.

In the hydrophilization treatment liquid, the total content of abrasive grains and a basic compound is preferably not greater than 0.1 wt. %.

The pH of the hydrophilization treatment liquid is preferably less than 8.

In the hydrophilization treatment liquid, the weight average molecular weight of the compound represented by Formula (1) is preferably from 100 to 3000.

In the hydrophilization treatment liquid, an HLB value of the compound represented by Formula (1) is preferably 14 or greater.

The hydrophilization treatment liquid may be a rinse polishing solution.

The invention according to the present disclosure also provides a method for manufacturing a semiconductor device, the method including subjecting a semiconductor wafer surface to a hydrophilization treatment using the hydrophilization treatment liquid.

Advantageous Effects of Invention

According to the hydrophilization treatment liquid of the present disclosure, when the hydrophilization treatment liquid is applied to a wafer surface, a hydrophilic film is formed, and thereby hydrophilicity can be imparted to the wafer surface. As a result, the deposition of contaminants such as particles, metal impurities, and organic matter to the wafer surface can be prevented.

Furthermore, if the hydrophilization treatment liquid of the present disclosure is used as a rinse polishing solution on the wafer surface after finish polishing, hydrophilicity can be imparted to the wafer surface. As a result, the wafer surface does not revert to a hydrophobic state even after rinse polishing. Therefore, the hydrophilicity of the wafer surface is maintained, and the deposition of contaminants such as particles, metal impurities, and organic matter can be prevented.

As described above, according to the hydrophilization treatment liquid of the present disclosure, a high-quality semiconductor wafer in which the degree of cleanliness of the wafer surface is maintained and surface defects (LPD) and surface roughness (haze) are reduced can be manufactured.

DESCRIPTION OF EMBODIMENTS

1. Hydrophilization Treatment Liquid for Semiconductor Wafer Surface

The hydrophilization treatment liquid according to an embodiment of the present disclosure is used to impart hydrophilicity to a semiconductor wafer surface. The hydrophilization treatment liquid according to an embodiment of the present disclosure contains, as essential components, water and a compound represented by Formula (1) below (hereinafter, also referred to as a "polyglycerin derivative"), and the total content of the water and the compound represented by Formula (1) below is 95 wt. % or greater.

(Compound Represented by Formula (1))

$$R^1O\text{---}(C_3H_6O_2)_n\text{---}H \quad (1)$$

where $R^1$ denotes a hydrogen atom, a hydrocarbon group having from 1 to 24 carbon atoms and optionally having a hydroxyl group, or a group represented by $R^2CO$, the $R^2$ denoting a hydrocarbon group having from 1 to 24 carbon atoms; and n indicates an average degree of polymerization of a glycerin unit shown in the parentheses, and is from 2 to 60.

The $C_3H_6O_2$ in the parentheses of Formula (1) may have only a structure represented by Formula (2) below, may have only a structure represented by Formula (3) below, or may have both structures represented by Formulas (2) and (3) below.

$$\text{---}CH_2\text{---}CHOH\text{---}CH_2O\text{---} \quad (2)$$

$$\text{---}CH(CH_2OH)CH_2O\text{---} \quad (3)$$

The $R^1$ contains from 5 to 75% of a hydrogen atom in one molecule.

Examples of a hydrocarbon group in the $R^1$ and $R^2$ include an aliphatic hydrocarbon group, alicyclic hydrocarbon group, aromatic hydrocarbon group, and group in which two or more of these are bonded.

Examples of the aliphatic hydrocarbon group include a linear alkyl group having from 1 to 24 carbon atoms (preferably from 5 to 20, more preferably from 10 to 20, and even more preferably from 12 to 18), such as a methyl group, ethyl group, propyl group, pentyl group, hexyl group, heptyl group, octyl group, decyl group, dodecyl group (lauryl group), tetradecyl group, myristyl group, cetyl group, and stearyl group, a branched alkyl group having from 3 to 24 carbon atoms (preferably from 5 to 20, more preferably from 10 to 20, and even more preferably from 12 to 18), such as a 2-ethylhexyl group, isooctyl group, isodecyl group, isododecyl group, isomyristyl group, isocetyl group, and an isostearyl group; a linear or branched alkenyl group having from 2 to 24 (preferably from 10 to 20 and more preferably from 8 to 18) carbon atoms such as a vinyl group, propenyl group, allyl group, hexenyl group, 2-ethylhexenyl group, and an oleyl group; a linear or branched alkapolyenyl group having from 2 to 24 (preferably from 2 to 18) carbon atoms such as an alkadienyl group, alkatrienyl group, alkatetraenyl group, linoleyl group, and a linolenyl group: and linear or branched alkynyl groups having from 2 to 24 carbon atoms such as an ethynyl group and a propynyl group.

Among these, the alkyl group is preferably a linear or branched alkyl group having from 12 to 18 carbon atoms, such as a dodecyl group and an isostearyl group. Moreover, the alkenyl group is preferably, among these, a linear or branched alkenyl group having from 8 to 18 carbon atoms, such as a hexenyl group or an oleyl group.

Examples of the alicyclic hydrocarbon group include: a cycloalkyl group of from 3 to 24 members (preferably from 3 to 15 members, and particularly preferably from 5 to 8 members) such as a cyclopropyl group, a cyclobutyl group, a cyclopentyl group, and a cyclooctyl group; a cycloalkenyl group of from 3 to 24 members (preferably from 3 to 15 members, and particularly preferably from 5 to 8 members) such as a cyclopentenyl group and a cyclohexenyl group; and a bridged cyclic hydrocarbon group such as a perhydronaphthalen-1-yl group, a norbornyl group, an adamantyl group, a tricyclo[5.2.1.0$^{2.6}$]decan-8-yl group, and a tetracyclo[4.4.0.1$^{2.5}$.1$^{7.10}$]dodecan-3-yl group.

Examples of the aromatic hydrocarbon group include aryl groups having from 6 to 24 (preferably from 6 to 15) carbon atoms, such as a phenyl group and a naphthyl group.

Examples of the hydrocarbon group formed by bonding an aliphatic hydrocarbon group and an alicyclic hydrocarbon group include a cycloalkyl substituted alkyl group (for example, a $C_{3-20}$ cycloalkyl substituted $C_{1-4}$ alkyl group), such as a cyclopentylmethyl group, a cyclohexylmethyl group, and a 2-cyclohexylethyl group. Furthermore, examples of the hydrocarbon group formed by bonding an aliphatic hydrocarbon group and an aromatic hydrocarbon group include: an aralkyl group (for example, a $C_{7-18}$ aralkyl group), and an alkyl substituted aryl group (for example, a phenyl group or naphthyl group substituted with one to four $C_{1-4}$ alkyl groups).

Examples of the group represented by $R^2CO$ include an aliphatic acyl group such as an acetyl group, propionyl group, butyryl group, isobutyryl group, stearoyl group, and an oleoyl group; and an aromatic acyl group such as a benzoyl group, toluoyl group, and naphthoyl group.

The $R^1$ is, among these, preferably at least one type selected from the group consisting of an alkyl group, an acyl group, and a hydrogen atom. Additionally, the $R^1$ is particularly preferably at least one type selected from the group consisting of a linear alkyl group (among these, a linear alkyl group having from 1 to 24 carbons, such as a methyl group, an ethyl group, a propyl group, a decyl group, a dodecyl group (lauryl group), and a stearyl group, and particularly an alkyl group having from 10 to 20 carbons, such as a dodecyl group), a branched alkyl group (among these, a branched alkyl group having from 10 to 20 carbons, such as an isostearyl group), an aliphatic acyl group (among these, an acetyl group, a butyl group, a stearoyl group, and an oleoyl group, and particularly an acetyl group or an oleoyl group), and a hydrogen atom.

In Formula (1), n indicates the average degree of polymerization of glycerin. As presented with regard to the method described below for manufacturing a compound represented by Formula (1), when, for example, a polyglycerol ether is to be produced from an alcohol and a glycidol, the value of n can be easily varied by adjusting the molar ratio of the alcohol and the 2,3-epoxy-1-propanol (trade name "glycidol", available from Daicel Corporation) that are to be reacted.

The average degree of polymerization n in Formula (1) is, for example, from 2 to 60, preferably from 2 to 40, more preferably from 4 to 20, and even more preferably from 4 to 10. When n is 2 or greater, the water solubility will be further improved and, therefore, excellent cleaning performance is achieved. Furthermore, the property of adsorption to the semiconductor wafer surface is excellent, and formation of the hydrophilic coating is further improved. When n is 60 or less, excellent hydrophilicity is exhibited, and dispersibility in water is further improved. In addition, unnecessary foaming is suppressed, and workability is further improved. In the present specification, the method for calculating the average degree of polymerization of glycerin constituting the polyglycerin is not particularly limited. Examples thereof include a method of calculating from a hydroxyl value, and a method of determining the composition of the polyglycerin through gas chromatography, liquid chromatography, thin layer chromatography, gas chromatograph mass spectrometry or liquid chromatograph mass spectrometry, and then calculating the average degree of polymerization.

In addition, when $R^1$ in Formula (1) is an alkyl group (in particular, a linear or branched alkyl group such as a lauryl group, a stearyl group, or an isostearyl group), n is from 2 to 60. Among this range, from the perspective of achieving excellent adsorption to the surface of the semiconductor wafer and excelling in the formation of a hydrophilic coating, when $R^1$ in Formula (1) is an alkyl group, n is preferably from 2 to 30, more preferably from 4 to 20, even more preferably from 4 to 15, and most preferably from 4 to 10.

In addition, when $R^1$ in Formula (1) is a hydrogen atom, n is from 2 to 60. Among this range, from the perspective of achieving excellent adsorption to the surface of the semiconductor wafer and excelling in the formation of the hydrophilic coating, when $R^1$ in Formula (1) is a hydrogen atom, n is preferably from 2 to 30, more preferably from 4 to 20, even more preferably from 4 to 15, and most preferably from 4 to 10.

On the other hand, when $R^1$ in Formula (1) is an acyl group, n is from 2 to 60. Among this range, from the perspective of achieving excellent adsorption to the surface of the semiconductor wafer and excelling in the formation of the hydrophilic coating, when $R^1$ in Formula (1) is an acyl group, n is preferably from 2 to 30, more preferably from 4 to 20, even more preferably from 4 to 15, and most preferably from 4 to 10.

When the value of n falls outside the range described above, adsorption onto the semiconductor wafer surface tends to deteriorate. Furthermore, when the value of n falls below the range described above, hydrophilicity decreases, a hydrophilic coating is not formed on the semiconductor wafer surface, and it tends to be difficult to impart hydrophilicity.

The weight average molecular weight of the compound represented by Formula (1) is, for example, from 100 to 3000. Among this range, from the perspective of achieving excellent adsorption to the surface of the semiconductor wafer and excelling in the formation of a hydrophilic coating, the weight average molecular weight is preferably from 200 to 3000, more preferably from 200 to 2000, even more preferably from 300 to 2000, and most preferably from 400 to 1500. Furthermore, in addition to the perspective described, from the perspective of excelling in workability, the weight average molecular weight of the compound is more preferably from 400 to 1000, and most preferably from 400 to 800. Note that in the present specification, the weight average molecular weight is measured by gel permeation chromatography (GPC).

From the perspective of achieving excellent dispersion stability, the hydrophile-lipophile balance (HLB) value of the compound represented by Formula (1) is, for example, 14 or greater, preferably from 14 to 20, and more preferably from 14 to 18. Note that the HLB value can be calculated by the Griffin method.

Among the compounds represented by Formula (1) in an embodiment of the present disclosure, the compound thereof is preferably at least one compound selected from compounds represented by Formulas (1-1) to (1-8) below, and is particularly preferably at least one compound selected from compounds represented by Formulas (1-1) to (1-4) and (1-6) to (1-8) below.

$$C_{12}H_{25}O-(C_3H_6O_2)_4-H \tag{1-1}$$

$$C_{12}H_{25}O-(C_3H_6O_2)_{10}-H \tag{1-2}$$

$$C_{18}H_{37}-O-(C_3H_6O_2)_4-H \tag{1-3}$$

$$C_{18}H_{37}-O-(C_3H_6O_2)_{10}-H \tag{1-4}$$

$$CH_2=CH-CH_2-O-(C_3H_6O_2)_6-H \tag{1-5}$$

$$HO-(C_3H_6O_2)_{10}-H \tag{1-6}$$

$$HO-(C_3H_6O_2)_{20}-H \tag{1-7}$$

$$C_{12}H_{25}O-(C_3H_6O_2)_6-H \tag{1-8}$$

Examples of methods for producing a compound represented by Formula (1) in an embodiment of the present disclosure include: [1] a method of addition polymerization of 2,3-epoxy-1-propanol with a compound represented by $R^1OH$ ($R^1$ being the same as described above) in the presence of an alkali catalyst, [2] a method of reacting, with polyglycerin, a compound represented by $R^1X$ (where X denotes a halogen atom- and $R^1$ is the same as above, such as, for example, an alkyl halide and an acid halide), [3] a method of reacting a reactive derivative of a carboxylic acid such as an acid anhydride with a polyglycerin, and [4] a method of reacting, with a polyglycerin, a polyol such as a glycidyl ether compound represented by Formula (4) below.

[Chemical 1]

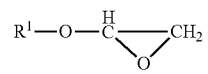

(4)

(Wherein, $R^1$ is the same as described above.)

Examples of the alkali catalyst used in the method [1] described above include sodium hydroxide, potassium hydroxide, lithium hydroxide, metallic sodium, and sodium hydride. One type of these can used alone or two or more types can be used in combination.

Examples of the alkyl halide used in the method [2] described above include alkyl chlorides, alkyl bromides, and alkyl iodides.

Commercially available products such as those of trade names "PGL 03P (polyglycerol trimer)", "PGL 06 (polyglycerol hexamer)", "PGL 10PSW (polyglycerol decamer)", and "PGL XPW (polyglycerol 40-mer)" (available from Daicel Corporation) can be suitably used as the polyglycerin that is used in methods [2] to [4] described above.

Examples of the polyol used in the method [4] described above include 2,3-epoxy-1-propanol, ethylene glycol, propylene glycol, 1,3-propanediol (trimethylene glycol), glycerin, xylitol, and sorbitol.

The hydrophilization treatment liquid of an embodiment of the present disclosure contains at least one compound represented by Formula (1) above. As described above, examples of the compound represented by Formula (1) above include polyglycerin, polyglycerol monoethers, and polyglycerol monoesters. Thus, the hydrophilization treatment liquid of an embodiment of the present disclosure contains at least one type of polyglycerin derivative selected from polyglycerin, polyglycerol monoethers, and polyglycerol monoesters.

In addition to polyglycerin, polyglycerol monoethers, and polyglycerol monoesters, as a polyglycerin derivative, the hydrophilization treatment liquid according to an embodiment of the present disclosure may contain, for example, polyglycerol diethers and polyglycerol diesters corresponding to the compounds. In the hydrophilization treatment liquid according to an embodiment of the present disclosure, from the perspective of imparting excellent hydrophilicity, the total content of the polyglycerin, polyglycerol monoethers, and polyglycerol monoesters is preferably 75 wt. % or greater and more preferably 90 wt. % or greater of the total amount of polyglycerin derivatives included in the hydrophilization treatment liquid of an embodiment of the present disclosure. Furthermore, the total content of the polyglycerol diether and polyglycerol diester is preferably not greater than 5 wt. %, and particularly preferably not greater than 1 wt. %, of the total amount of polyglycerin derivatives included in the hydrophilization treatment liquid of an embodiment of the present disclosure. The content of each component included in the polyglycerin derivatives is determined by separating each component using high performance liquid chromatography, calculating the peak area using a differential refractive index detector, and calculating the area ratio.

The hydrophilization treatment liquid according to an embodiment of the present disclosure contains a compound represented by Formula (1) above as a nonvolatile component. The hydrophilization treatment liquid according to an embodiment of the present disclosure may contain another component (for example, a water-soluble polymer compound such as a cellulose derivative) as a nonvolatile component, but the content of the compound represented by Formula (1) relative to the total amount of the nonvolatile component included in the hydrophilization treatment liquid according to an embodiment of the present disclosure (=percentage of the content of the compound represented by Formula (1)) is, for example, preferably 10 wt. % or greater from the perspective of excelling in adsorption to the semiconductor wafer and having an excellent effect of protecting the surface of the semiconductor wafer by adsorption thereon, and is more preferably 30 wt. % or greater, even more preferably 50 wt. % or greater, yet even more preferably 70 wt. % or greater, and most preferably 90 wt. % or greater (for example, 95 wt. %, preferably 97 wt. %, more preferably 99.9 wt. %, and even more preferably 99.99 wt. %). Note that the upper limit is 100 wt. %. That is, the hydrophilization treatment liquid according to an embodiment of the present disclosure may contain substantially only the compound represented by Formula (1) as a nonvolatile component.

The content of the compound represented by Formula (1) in the hydrophilization treatment liquid according to an embodiment of the present disclosure is not particularly limited, but is preferably 0.01 wt. % or greater, more preferably 0.02 wt. % or greater, even more preferably 0.05 wt. % or greater, particularly preferably 0.1 wt. % or greater, and most preferably 0.2 wt. % or greater per 100 wt. % of the hydrophilization treatment liquid according to an embodiment of the present disclosure. Furthermore, the content is preferably not greater than 1.5 wt. %, more preferably not greater than 1.0 wt. %, even more preferably not greater than 0.7 wt. %, and particularly preferably not greater than 0.5 wt. %. When the content of the compound represented by Formula (1) is within the range described above, adsorption to a semiconductor wafer surface is excellent, and a hydrophilic coating is formed by adsorbing to the semiconductor wafer, and the effect of protecting the surface is further improved. In particular, when the content of the compound represented by Formula (1) is equal to or greater than the lower limit described above, the hydrophilization treatment liquid excels in cleaning power, and hydrophilicity can be more excellently imparted to the finish polished semiconductor wafer surface. Furthermore, when the content thereof is less than or equal to the upper limit described above, formation of bubbles due to the compound represented by Formula (1) remaining on the wafer surface is suppressed, and surface contamination (for example, contaminants being affixed to the surface through an action like that of an adhesive) and other such problems do not occur. The content of the compound represented by Formula (1) above is the total content of all of the compounds represented by Formula (1) above in the hydrophilization treatment liquid according to an embodiment of the present disclosure.

(Water)

The hydrophilization treatment liquid according to an embodiment of the present disclosure contains water as an essential component. In the present disclosure, water is, for example, a medium for washing a semiconductor wafer surface. Pure water is typically used, and of the types of water, ultrapure water is preferable. Ultrapure water refers to water having an impurity content ratio of not greater than 0.01 μg/L. Note that ultrapure water is also included in the "pure water" herein.

The content of water in the hydrophilization treatment liquid according to an embodiment of the present disclosure is not particularly limited, but is preferably 93.5 wt. % or greater, and more preferably 95 wt. % or greater (for example, 98.5 wt. % or greater, 99 wt. % or greater, 99.5 wt. % or greater, 99.95 wt. % or greater, and 99.98 wt. % or greater) per 100 wt. % of the hydrophilization treatment liquid according to an embodiment of the present disclosure. When the content of the water is greater than or equal to the lower limit described above, the cleaning effect of the semiconductor wafer surface is excellent, and hydrophilicity is more excellently imparted.

The hydrophilization treatment liquid according to an embodiment of the present disclosure contains water and a compound represented by Formula (1) above, and the total content of the water and the compound represented by Formula (1) above is, for example, 95 wt. % or greater (for example, 98 wt. % or greater, or 99 wt. % or greater), more preferably 99.5 wt. % or greater, even more preferably 99.95 wt. % or greater, particularly preferably 99.98 wt. % or greater, and most preferably 100 wt. %.

(Other Components)

The hydrophilization treatment liquid according to an embodiment of the present disclosure may further contain other components in a range that does not hinder the effects of the present disclosure. Examples of the other components include a pH modifier, alcohol, and chelant.

From the perspective of maintaining a high degree of cleanliness of the semiconductor wafer surface and suppressing excessive etching, the hydrophilization treatment liquid according to an embodiment of the present disclosure preferably substantially contain no abrasive grain and basic compound (for example, an alkali metal hydroxide, amine, ammonia, ammonium hydroxide salts, and the like). That is, the total content of an abrasive grain and a basic compound in the hydrophilization treatment liquid according to an embodiment of the present disclosure is, for example, not greater than 0.1 wt. % (from 0 to 0.1 wt. %), and preferably not greater than 0.001 wt. % (from 0 to 0.001 wt. %), and most preferably, abrasive grains and basic compounds are not compounded (0%).

From the perspective of maintaining a high degree of cleanliness of the semiconductor wafer surface and forming a good hydrophilic coating, the hydrophilization treatment liquid according to an embodiment of the present disclosure preferably contains substantially no other components other than water and the compound represented by Formula (1). That is, the content of the other components per 100 wt. % of the hydrophilization treatment liquid according to an embodiment of the present disclosure is preferably less than 5 wt. % (from 0 to 5 wt. %), more preferably less than 3 wt. % (from 0 to 3 wt. %), even more preferably less than 1 wt. % (from 0 to 1 wt. %), and particularly preferably less than 0.01 wt. % (from 0 to 0.01 wt. %), and most preferably, other components are not compounded (0 wt. %). If the other components are substantially not included (that is, the content thereof is from 0 to less than 5 wt. %), the washing and hydrophilization treatment of the semiconductor wafer surface can be performed most effectively without interference by other components.

The pH at 25° C. of the hydrophilization treatment liquid according to an embodiment of the present disclosure is, for example, less than 8.0, preferably not greater than 7.8, more preferably not greater than 7.5, and even more preferably not greater than 7.3. When the pH is less than 8, the semiconductor wafer surface after finish polishing can be washed, the degree of alkalinity can be reduced, and excessive etching can be suppressed. Here, the pH at 25° C. can be measured using a commercially available pH meter, and refers to a value obtained by immersing the electrode in the hydrophilization treatment liquid according to an embodiment of the present disclosure, and recording a measurement after one minute.

Next, an example of a method for producing the hydrophilization treatment liquid according to an embodiment of the present disclosure will be described.

The hydrophilization treatment liquid according to an embodiment of the present disclosure can be produced according to a well-known method for producing a liquid chemical with the exception of adding the compound represented by Formula (1) above into the water.

The content of each component of the hydrophilization treatment liquid according to an embodiment of the present disclosure as described above is the content when used. Therefore, the hydrophilization treatment liquid according to an embodiment of the present disclosure may be supplied in a form that can be prepared at the time of use (hereinafter, also referred to as a "material for preparing a hydrophilization treatment liquid according to an embodiment of the present disclosure").

The material for preparing a hydrophilization treatment liquid according to an embodiment of the present disclosure is a material that can be used to prepare the hydrophilization treatment liquid according to an embodiment of the present disclosure by diluting with water, for example. The material for preparing a hydrophilization treatment liquid according to an embodiment of the present disclosure can be in various liquid forms such as a solution, an emulsion, or a suspension, or can be in various forms such as a gel, a capsule, a powder, particles, or granular, which are solidified or semi-solidified or encapsulated.

When the material for preparing a hydrophilization treatment liquid according to an embodiment of the present disclosure is in a form of a solution (concentrated liquid), the dilution ratio is not particularly limited, but from the perspectives of distribution costs and storage space reduction, the dilution ratio is preferably not less than 2 times, more preferably not less than 10 times, and even more preferably not less than 50 times.

When the material for preparing a hydrophilization treatment liquid according to an embodiment of the present disclosure is in a form of a solution (concentrated liquid), the content of the compound represented by Formula (1) above is, for example, not less than 3 wt. %, and more preferably not less than 15 wt. %, per 100 wt. % of the material for preparing a hydrophilization treatment liquid according to an embodiment of the present disclosure. Furthermore, the lower limit of the content is preferably not greater than 75 wt. % and more preferably not greater than 50 wt. %. When at or above the lower limit value described above, the material for preparing a hydrophilization treatment liquid according to an embodiment of the present disclosure excels in a reduction of distribution costs and storage space. Furthermore, when at or below the upper limit value, the material for preparing a hydrophilization treatment liquid according to an embodiment of according to the present disclosure excels in handling property (ease of preparation).

The material for preparing a hydrophilization treatment liquid according to an embodiment of the present disclosure can be produced according to a known method for producing a liquid agent, solid agent, semi-solid agent, gel agent, capsule agent, powdered agent, granules, and the like, with the exception of adding a compound represented by Formula (1) above to the water.

In the hydrophilization treatment liquid according to an embodiment of the present disclosure, the compound represented by Formula (1) can be adsorbed with excellent adsorption force onto the semiconductor wafer surface, thereby forming a good hydrophilic coating, and maintaining a high degree of cleanliness of the semiconductor wafer surface. Through this, a high-quality semiconductor wafer can be manufactured with reduced surface defects (LPD) and surface roughness (haze).

The hydrophilization treatment liquid according to an embodiment of the present disclosure can be used, for example, in a step of subjecting a semiconductor wafer surface to a hydrophilization treatment in a semiconductor wafer manufacturing process. This type of step is not particularly limited, but examples include a cutting step in which a silicon monocrystalline ingot is cut into a predetermined silicon wafer, a polishing step for polishing the silicon wafer (typically, there are three stages of primary polishing, secondary polishing, and finish polishing), and a washing step of washing the silicon wafer. Among these, the hydrophilization treatment liquid according to an embodiment of the present disclosure is preferably used as a rinse polishing solution in a washing step that is subsequently performed after the finish polishing in the polishing step.

An example of using the hydrophilization treatment liquid according to an embodiment of the present disclosure as a rinse polishing solution is described below.

A semiconductor wafer that has been subjected to finish polishing is disposed on a polishing device (not illustrated) provided with a holder that holds the semiconductor wafer, and a polishing disc on which a polishing pad is attached.

Next, rinse polishing is performed while supplying the hydrophilization treatment liquid according to an embodiment of the present disclosure onto the polishing pad. The hydrophilization treatment liquid is continuously supplied at this time by a pump or the like. The supplied amount of the hydrophilization treatment liquid according to an embodiment of the present disclosure is not particularly limited as long as the surface of the polishing pad is always covered by the treatment liquid, but is, for example, not less than 100 ml/min, and preferably not less than 150 ml/min.

The polishing pressure during rinse polishing is not particularly limited, but pressure is applied preferably in a range from 50 to 300 gf/cm$^2$, and more preferably in a range from 80 to 250 gf/cm$^2$.

The rotational speed of the polishing disc during rinse polishing is not particularly limited, but for example, is preferably in the range from 50 to 200 rpm, and more preferably from 60 to 150 rpm.

The rinse time during rinse polishing is not particularly limited, but for example, can be appropriately set in a range from 1 to 10 minutes, and is preferably from 2 to 7 minutes.

Note that after the rinse polishing described above, water polishing may be added separately. Even when further water polishing is performed after rinse polishing has been performed with the hydrophilization treatment liquid according to an embodiment of the present disclosure, the state of the surface of the hydrophilic semiconductor wafer is favorably maintained.

Each of the configurations of the various embodiments described above and combinations thereof are examples, and as appropriate, configurational additions, omissions, substitutions, and other changes can be made within a range that does not deviate from the spirit of the invention according to the present disclosure. The invention according to the present disclosure is not limited by these embodiments and is limited only by the scope of the claims.

Each aspect disclosed in the present specification can be combined with any other feature disclosed herein.

EXAMPLES

Hereinafter, the invention according to the present disclosure will be described more specifically through examples, but the invention according to the present disclosure is not limited by these examples.

Production Example 1

Four moles of 2,3-epoxy-1-propanol (trade name "Glycidol", available from Daicel Corporation) were added to 1 mol of lauryl alcohol to obtain a compound (A1) ($C_{12}H_{25}O$—($C_3H_6O_2$)$_4$—H, weight average molecular weight: 482).

Production Example 2

A compound (A2) ($C_{12}H_{25}O$—($C_3H_6O_2$)$_{10}$—H, weight average molecular weight: 926) was produced in the same manner as in Example 1 with the exception that the usage amount of 2,3-epoxy-1-propanol was changed to 10 mol.

Production Example 3

A compound (A3) ($C_{12}H_2O$—($C_3H_6O_2$)$_6$—H, weight average molecular weight: 630) was produced in the same manner as in Example 1 with the exception that the usage amount of 2,3-epoxy-1-propanol was changed to 6 mol.

Production Example 4

Ten moles of 2,3-epoxy-1-propanol (trade name "Glycidol", available from Daicel Corporation) were added to 1 mol of isostearyl alcohol, and a compound (A4) ($C_{18}H_{37}O$—($C_3H_6O_2$)$_{10}$—H, weight average molecular weight: 1010) was produced.

Production Example 5

Nine moles of 2,3-epoxy-1-propanol (trade name "Glycidol", available from Daicel Corporation) were added to 1 mol of glycerin, and a compound (A5) (HO—($C_3H_6O_2$)$_{10}$—H, weight average molecular weight: 758) was produced.

Production Example 6

A compound (A6) (HO—($C_3H_6O_2$)$_{20}$—H, weight average molecular weight: 1498) was produced in the same manner as in Example 5 with the exception that the usage amount of 2,3-epoxy-1-propanol was changed to 19 mol.

Test solutions of Examples 1 to 36 were prepared according to the formulations listed in Table 1 using compounds (A1) to (A6) produced in Production Examples 1 to 6 described above. Pure water was prepared as the test solution of Comparative Example 1.

1. Evaluation of the Hydrophilicity of the Semiconductor Wafer after Rinse Polishing Multiple wafers which had completed secondary polishing were prepared. The wafers were placed in a polishing machine and subjected to finish polishing under the following conditions, and next, with each finish-polished wafer remaining in the polishing machine, each wafer was subjected to rinse polishing. The test solutions of the Examples and Comparative Example 1 were used in the rinse polishing. The state of each wafer surface immediately after rinse polishing and after 1 hour has passed was visually observed, and the results were evaluated on the basis of the following evaluation criteria. The results are shown in Table 1.

(Conditions of Finish Polishing)
pH: 10
Slurry: Nanopure NP8020 (available from Nitta Haas Inc.), high purity colloidal silica, abrasive grain concentration of 9.5 wt. %, abrasive grain size from 60 to 80 nm
Polishing pad: Whitex-DV18 (available from Nitta Haas Inc.)
Polishing machine: RN20 (available from Nitta Haas Inc.)
Polishing disc rotational speed: 115 rpm
Slurry flow rate: 300 ml/min
Polishing pressure: 100 gf/cm$^2$ (Conditions of Rinse Polishing)
Rinse time: 5 minutes
Polishing disc rotational speed: 115 rpm
Flow rate of rinse polishing solution: 300 ml/min
Polishing pressure: 100 gf/cm$^2$ Note that for one minute after rinse polishing, water polishing was implemented under the same conditions as those of rinse polishing, using pure water in place of the test solution.

(Evaluation Criteria)
Good: The entire surface of the wafer surface is wet, and there is no dry portion.
Poor: There is a dry portion on at least a portion of the wafer surface.

TABLE 1

| | Composition | | | | Evaluation | |
| --- | --- | --- | --- | --- | --- | --- |
| | Polyglycerin Derivative | | | | | |
| | Compound Represented by Formula (1) | Content (wt. %) | Pure Water | Total (wt. %) | Immediately After Rinse Polishing | After 1 Hour |
| Example 1 | (A1) | 0.05 | Balance | 100 | Good | Good |
| Example 2 | (A1) | 0.1 | Balance | 100 | Good | Good |
| Example 3 | (A1) | 0.2 | Balance | 100 | Good | Good |
| Example 4 | (A1) | 0.5 | Balance | 100 | Good | Good |
| Example 5 | (A1) | 1.0 | Balance | 100 | Good | Good |
| Example 6 | (A1) | 1.5 | Balance | 100 | Good | Good |
| Example 7 | (A2) | 0.05 | Balance | 100 | Good | Good |
| Example 8 | (A2) | 0.1 | Balance | 100 | Good | Good |
| Example 9 | (A2) | 0.2 | Balance | 100 | Good | Good |
| Example 10 | (A2) | 0.5 | Balance | 100 | Good | Good |
| Example 11 | (A2) | 1.0 | Balance | 100 | Good | Good |
| Example 12 | (A2) | 1.5 | Balance | 100 | Good | Good |
| Example 13 | (A3) | 0.05 | Balance | 100 | Good | Good |
| Example 14 | (A3) | 0.1 | Balance | 100 | Good | Good |
| Example 15 | (A3) | 0.2 | Balance | 100 | Good | Good |
| Example 16 | (A3) | 0.5 | Balance | 100 | Good | Good |
| Example 17 | (A3) | 1.0 | Balance | 100 | Good | Good |
| Example 18 | (A3) | 1.5 | Balance | 100 | Good | Good |
| Example 19 | (A4) | 0.05 | Balance | 100 | Good | Good |
| Example 20 | (A4) | 0.1 | Balance | 100 | Good | Good |
| Example 21 | (A4) | 0.2 | Balance | 100 | Good | Good |
| Example 22 | (A4) | 0.5 | Balance | 100 | Good | Good |
| Example 23 | (A4) | 1.0 | Balance | 100 | Good | Good |
| Example 24 | (A4) | 1.5 | Balance | 100 | Good | Good |
| Example 25 | (A5) | 0.05 | Balance | 100 | Good | Good |
| Example 26 | (A5) | 0.1 | Balance | 100 | Good | Good |
| Example 27 | (A5) | 0.2 | Balance | 100 | Good | Good |
| Example 28 | (A5) | 0.5 | Balance | 100 | Good | Good |
| Example 29 | (A5) | 1.0 | Balance | 100 | Good | Good |
| Example 30 | (A5) | 1.5 | Balance | 100 | Good | Good |
| Example 31 | (A6) | 0.05 | Balance | 100 | Good | Good |
| Example 32 | (A6) | 0.1 | Balance | 100 | Good | Good |
| Example 33 | (A6) | 0.2 | Balance | 100 | Good | Good |
| Example 34 | (A6) | 0.5 | Balance | 100 | Good | Good |
| Example 35 | (A6) | 1.0 | Balance | 100 | Good | Good |
| Example 36 | (A6) | 1.5 | Balance | 100 | Good | Good |
| Comparative Example 1 | — | — | 100 | 100 | Poor | Poor |

(Note)
In the table, "—" indicates not blended.

(Evaluation of Results)

The wafer surfaces immediately after rinse polishing with the test solutions of the examples exhibited strong hydrophilicity and were wet over the entire surface. Furthermore, the wet state of the wafer surfaces was maintained even after 1 hour has passed. On the other hand, the wafer surface that was rinse polished with the test solution of Comparative Example 1 was found to be partially dry even immediately after rinse polishing, and moisture formed water droplets, and the wafer surface was not made hydrophilic.

The configuration of the invention according to the present disclosure and variations thereof are presented below as a summary of the foregoing.

[1] A composition containing water and a compound represented by Formula (1) below, wherein a total content of the water and the compound represented by Formula (1) is 95 wt. % or greater.

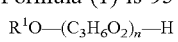
(1)

where R1 denotes a hydrogen atom, a hydrocarbon group having from 1 to 24 carbon atoms and optionally having a hydroxyl group, or a group represented by R2CO, the R2 denoting a hydrocarbon group having from 1 to 24 carbon atoms; and n indicates an average degree of polymerization of a glycerin unit shown in the parentheses, and is from 2 to 60.

[2] The composition according to [1], wherein $R^1$ in the Formula is a hydrocarbon group having from 12 to 18 carbons.

[3] The composition according to [1], wherein $R^1$ in the Formula is at least one selected from the group consisting of a dodecyl group, an isostearyl group, and a hydrogen atom.

[4] The composition according to [1], wherein $R^1$ in the Formula is a dodecyl group.

[5] The composition according to [1], wherein $R^1$ in the Formula is an isostearyl group.

[6] The composition according to [1], wherein $R^1$ in the Formula is a hydrogen atom.

[7] The composition according to any one of [1] to [6], wherein n in the Formula is from 2 to 40.

[8] The composition according to any one of [1] to [6], wherein n in the Formula is from 2 to 30.

[9] The composition according to any one of [1] to [6], wherein n in the Formula is from 2 to 20.

[10] The composition according to any one of [1] to [6], wherein n in the Formula is from 2 to 15.

[11] The composition according to any one of [1] to [6], wherein n in the Formula is from 2 to 10.

[12] The composition according to any one of [1] to [6], wherein n in the Formula is from 4 to 40.

[13] The composition according to any one of [1] to [6], wherein n in the Formula is from 4 to 30.

[14] The composition according to any one of [1] to [6], wherein n in the Formula is from 4 to 20.

[15] The composition according to any one of [1] to [6], wherein n in the Formula is from 4 to 15.

[16] The composition according to any one of [1] to [6], wherein n in the Formula is from 4 to 10.

[17] The composition according to any one of [1] to [16], wherein the content of the compound represented by Formula (1) is from 0.01 to 1.5 wt. %.

[18] The composition according to any one of [1] to [16], wherein the content of the compound represented by Formula (1) is from 0.01 to 1.0 wt. %.

[19] The composition according to any one of [1] to [16], wherein the content of the compound represented by Formula (1) is from 0.01 to 0.7 wt. %.

[20] The composition according to any one of [1] to [16], wherein the content of the compound represented by Formula (1) is from 0.01 to 0.5 wt. %.

[21] The composition according to any one of [1] to [16], wherein the content of the compound represented by Formula (1) is from 0.02 to 1.5 wt. %.

[22] The composition according to any one of [1] to [16], wherein the content of the compound represented by Formula (1) is from 0.02 to 1.0 wt. %.

[23] The composition according to any one of [1] to [16], wherein the content of the compound represented by Formula (1) is from 0.02 to 0.7 wt. %.

[24] The composition according to any one of [1] to [16], wherein the content of the compound represented by Formula (1) is from 0.02 to 0.5 wt. %.

[25] The composition according to any one of [1] to [16], wherein the content of the compound represented by Formula (1) is from 0.05 to 1.5 wt. %.

[26] The composition according to any one of [1] to [16], wherein the content of the compound represented by Formula (1) is from 0.05 to 1.0 wt. %.

[27] The composition according to any one of [1] to [16], wherein the content of the compound represented by Formula (1) is from 0.05 to 0.7 wt. %.

[28] The composition according to any one of [1] to [16], wherein the content of the compound represented by Formula (1) is from 0.05 to 0.5 wt. %.

[29] The composition according to any one of [1] to [16], wherein the content of the compound represented by Formula (1) is from 0.1 to 1.5 wt. %.

[30] The composition according to any one of [1] to [16], wherein the content of the compound represented by Formula (1) is from 0.1 to 1.0 wt. %.

[31] The composition according to any one of [1] to [16], wherein the content of the compound represented by Formula (1) is from 0.1 to 0.7 wt. %.

[32] The composition according to any one of [1] to [16], wherein the content of the compound represented by Formula (1) is from 0.1 to 0.5 wt. %.

[33] The composition according to any one of [1] to [32], wherein the total content of the abrasive grains and a basic compound is not greater than 0.1 wt. %.

[34] The composition according to any one of [1] to [32], wherein the total content of the abrasive grains and a basic compound is not greater than 0.001 wt. %.

[35] The composition according to any one of [1] to [34], wherein the pH is less than 8.0.

[36] The composition according to any one of [1] to [34], wherein the pH is not greater than 7.8.

[37] The composition according to any one of [1] to [34], wherein the pH is not greater than 7.5.

[38] The composition according to any one of [1] to [34], wherein the pH is not greater than 7.3.

[39] The composition according to any one of [1] to [38], wherein a weight average molecular weight of the compound represented by Formula (1) is from 100 to 3000.

[40] The composition according to any one of [1] to [38], wherein a weight average molecular weight of the compound represented by Formula (1) is from 100 to 2000.

[41] The composition according to any one of [1] to [38], wherein a weight average molecular weight of the compound represented by Formula (1) is from 100 to 1500.

[42] The composition according to any one of [1] to [38], wherein a weight average molecular weight of the compound represented by Formula (1) is from 100 to 1000.

[43] The composition according to any one of [1] to [38], wherein a weight average molecular weight of the compound represented by Formula (1) is from 100 to 800.

[44] The composition according to any one of [1] to [38], wherein a weight average molecular weight of the compound represented by Formula (1) is from 200 to 3000.

[45] The composition according to any one of [1] to [38], wherein a weight average molecular weight of the compound represented by Formula (1) is from 200 to 2000.

[46] The composition according to any one of [1] to [38], wherein a weight average molecular weight of the compound represented by Formula (1) is from 200 to 1500.

[47] The composition according to any one of [1] to [38], wherein a weight average molecular weight of the compound represented by Formula (1) is from 200 to 1000.
[48] The composition according to any one of [1] to [38], wherein a weight average molecular weight of the compound represented by Formula (1) is from 200 to 800.
[49] The composition according to any one of [1] to [38], wherein a weight average molecular weight of the compound represented by Formula (1) is from 300 to 3000.
[50] The composition according to any one of [1] to [38], wherein a weight average molecular weight of the compound represented by Formula (1) is from 300 to 2000.
[51] The composition according to any one of [1] to [38], wherein a weight average molecular weight of the compound represented by Formula (1) is from 300 to 1500.
[52] The composition according to any one of [1] to [38], wherein a weight average molecular weight of the compound represented by Formula (1) is from 300 to 1000.
[53] The composition according to any one of [1] to [38], wherein a weight average molecular weight of the compound represented by Formula (1) is from 300 to 800.
[54] The composition according to any one of [1] to [38], wherein a weight average molecular weight of the compound represented by Formula (I) is from 400 to 3000.
[55] The composition according to any one of [1] to [38], wherein a weight average molecular weight of the compound represented by Formula (I) is from 400 to 2000.
[56] The composition according to any one of [1] to [38], wherein a weight average molecular weight of the compound represented by Formula (1) is from 400 to 1500.
[57] The composition according to any one of [1] to [38], wherein a weight average molecular weight of the compound represented by Formula (1) is from 400 to 1000.
[58] The composition according to any one of [1] to [38], wherein a weight average molecular weight of the compound represented by Formula (1) is from 400 to 800.
[59] The composition according to any one of [1] to [58], wherein an HLB value of the compound represented by Formula (1) is 14 or greater.
[60] The composition according to any one of [1] to [58], wherein the HLB value of the compound represented by Formula (1) is from 14 to 20.
[61] The composition according to any one of [1] to [58], wherein the HLB value of the compound represented by Formula (1) is from 14 to 18.
[62] The composition according to any one of [1] to [61], the composition being a hydrophilization treatment liquid for a semiconductor wafer surface.
[63] The composition according to any one of [1] to [61], wherein the composition is a rinse polishing solution.
[64] A method for manufacturing a semiconductor device, the method including subjecting a semiconductor wafer surface to a hydrophilization treatment using the composition described in any one of [1] to [63].
[65] A composition manufacturing method for manufacturing the composition described in any one of [1] to [61], the method including causing water to contain a compound represented by Formula (1) above.
[66] A method of manufacturing a hydrophilization treatment liquid for a semiconductor wafer surface, wherein the composition described in [65] is a hydrophilization treatment liquid for a semiconductor wafer surface.
[67] A method for manufacturing a rinse polishing solution, wherein the composition described in [65] is a rinse polishing solution.
[68] Use of the composition described in any one of [1] to [61] as a hydrophilization treatment liquid for a semiconductor wafer surface.
[69] Use of the composition described in any one of [1] to [61] as a rinse polishing solution.

INDUSTRIAL APPLICABILITY

According to the hydrophilization treatment liquid of the present disclosure, hydrophilicity can be imparted to a wafer surface by forming a hydrophilic film on the wafer surface. As a result, the deposition of contaminants such as particles, metal impurities, and organic matter to the wafer surface can be prevented. Thus, the invention according to the present disclosure is industrially applicable.

The invention claimed is:
1. A hydrophilization treatment liquid for a semiconductor wafer surface, the hydrophilization treatment liquid comprising:
water; and
a compound represented by Formula (1):

where $R^1$ denotes a hydrocarbon group having from 1 to 24 carbon atoms and optionally having a hydroxyl group; and n indicates an average degree of polymerization of a glycerin unit in the parentheses, and is from 2 to 60, wherein a total content of the water and the compound represented by Formula (1) is 95 wt. % or greater, wherein
a content of the compound represented by Formula (1) is from 0.2 to 1.5 wt. %,
a total content of abrasive grains and a basic compound is not greater than 0.001 wt. %, and
a weight average molecular weight of the compound represented by Formula (1) is from 100 to 1498.
2. The hydrophilization treatment liquid according to claim 1, wherein the total content of abrasive grains and a basic compound is substantially 0 wt. %.
3. The hydrophilization treatment liquid according to claim 1, having a pH of less than 8.
4. The hydrophilization treatment liquid according to claim 1, wherein the weight average molecular weight of the compound represented by Formula (1) is from 482 to 1498.
5. The hydrophilization treatment liquid according to claim 1, wherein an HLB value of the compound represented by Formula (1) is 14 or greater.
6. The hydrophilization treatment liquid according to claim 1, wherein the hydrophilization treatment liquid is a rinse polishing solution.
7. The hydrophilization treatment liquid according to claim 1, wherein n is from 2 to 15.
8. The hydrophilization treatment liquid according to claim 1, wherein the weight average molecular weight of the compound represented by Formula (1) is from 100 to 1000.

9. The hydrophilization treatment liquid according to claim 1, wherein n is from 2 to 15, and
the weight average molecular weight of the compound represented by Formula (1) is from 100 to 1000.

10. The hydrophilization treatment liquid according to claim 1, wherein an HLB value of the compound represented by Formula (1) is 14 to 20.

11. The hydrophilization treatment liquid according to claim 1, wherein n is from 6 to 15.

12. The hydrophilization treatment liquid according to claim 1, wherein an HLB value of the compound represented by Formula (1) is 14 or greater, and
n is from 6 to 15.

13. The hydrophilization treatment liquid according to claim 1, wherein
an HLB value of the compound represented by Formula (1) is 14 to 20, and
n is from 6 to 15.

14. A method for manufacturing a semiconductor device, the method comprising subjecting a semiconductor wafer surface to a hydrophilization treatment using the hydrophilization treatment liquid described in claim 1.

15. A method for manufacturing a semiconductor device, the method comprising subjecting a semiconductor wafer surface to a hydrophilization treatment using the hydrophilization treatment liquid described in claim 2.

* * * * *